US011420219B2

(12) United States Patent
Choi et al.

(10) Patent No.: US 11,420,219 B2
(45) Date of Patent: Aug. 23, 2022

(54) PRINTING APPARATUS FOR PRINTED ELECTRONICS

(71) Applicant: PROTEC CO., LTD., Anyang-si (KR)

(72) Inventors: Eui Keun Choi, Asan-si (KR); Dae Yong Lee, Suwon-si (KR); Da Hai Zhang, Anyang-si (KR); Seung Hwan Choi, Anyang-si (KR); Seung Min Hong, Anyang-si (KR)

(73) Assignee: PROTEC CO., LTD., Anyang-si (KR)

( * ) Notice: Subject to any disclaimer, the term of this patent is extended or adjusted under 35 U.S.C. 154(b) by 439 days.

(21) Appl. No.: 16/473,536

(22) PCT Filed: Jan. 12, 2018

(86) PCT No.: PCT/KR2018/000585
§ 371 (c)(1),
(2) Date: Jun. 25, 2019

(87) PCT Pub. No.: WO2018/131917
PCT Pub. Date: Jul. 19, 2018

(65) Prior Publication Data
US 2019/0329274 A1 Oct. 31, 2019

(30) Foreign Application Priority Data

Jan. 13, 2017 (KR) .......................... 10-2017-0005915

(51) Int. Cl.
*B05B 5/03* (2006.01)
*B05B 12/00* (2018.01)
(Continued)

(52) U.S. Cl.
CPC ................ *B05B 5/03* (2013.01); *B05B 12/00* (2013.01); *B41J 2/04505* (2013.01);
(Continued)

(58) Field of Classification Search
CPC .................. H05K 3/125; B41J 2/04505; B41J 2/04556–04561; B41J 2/135; B41J 2/145–155; B41J 2/17
See application file for complete search history.

(56) References Cited

U.S. PATENT DOCUMENTS

| 6,224,180 B1 * | 5/2001 | Pham-Van-Diep ..... B05B 5/001 347/2 |
| 2009/0237436 A1 * | 9/2009 | Sugahara ............... B41J 29/393 347/14 |
| 2011/0063368 A1 * | 3/2011 | Kim ...................... B41J 29/393 347/40 |

FOREIGN PATENT DOCUMENTS

| JP | 2009-517684 A | 4/2009 |
| JP | 2011-062681 A | 3/2011 |

(Continued)

*Primary Examiner* — Dah-Wei D. Yuan
*Assistant Examiner* — Stephen A Kitt
(74) *Attorney, Agent, or Firm* — Novick, Kim & Lee, PLLC; Jae Youn Kim

(57) ABSTRACT

A printing apparatus for printed electronics according to the present invention may include: ejection head units which each have at least one nozzle for ejecting ink droplets to perform drop-on-demand or continuous printing; a jetting observation unit which is provided at one side of the nozzle and configured to observe the ink droplet ejected from the nozzle; a lighting unit which is provided at the other side of the nozzle and configured to provide light to the jetting observation unit; an alignment observation unit which is configured to observe an aligned state between the nozzle and a substrate; and a fluid supply unit which is configured to supply the ink to the nozzle, in which the ejection head units include a single-nozzle head unit, and a multi-nozzle head unit provided separately from the single-nozzle head unit.

7 Claims, 13 Drawing Sheets

(51) Int. Cl.
*H05K 3/12* (2006.01)
*B41J 2/045* (2006.01)
(52) U.S. Cl.
CPC .......... *B41J 2/04561* (2013.01); *H05K 3/125* (2013.01); *H05K 3/1266* (2013.01); *H05K 2203/013* (2013.01)

(56) References Cited

FOREIGN PATENT DOCUMENTS

| | | |
|---|---|---|
| KR | 10-2011-0103546 A | 9/2011 |
| KR | 10-1078663 B1 | 11/2011 |
| KR | 10-1348024 B1 | 1/2014 |
| KR | 10-1347980 B1 | 2/2014 |
| KR | 10-2016-0013708 A | 2/2016 |
| KR | 10-2016-0031200 A | 3/2016 |

* cited by examiner

PRINTING APPARATUS FOR PRINTED ELECTRONICS

TECHNICAL FIELD

The present invention relates to a printing apparatus for printed electronics, and more particularly, to an all-in-one printing apparatus for printed electronics capable of patterning various types of inks by using a single printing apparatus.

BACKGROUND ART

As an inkjet technology is developed, an application range of the inkjet technology is expanding from an office field to a printed electronics field associated with the manufacture of electronic components and displays. As the application range of the inkjet technology is expanding to a manufacturing process, there is a need for a technology of precisely controlling a size of an ink droplet and precisely ejecting the ink droplet with precision within several micrometers to a desired position, unlike an office inkjet apparatus. Unlike a semiconductor process in the related art, the inkjet technology may be performed without wasting expensive materials and may easily implement enlargement, and as a result, researches are being actively conducted by applying the inkjet technology to a mass production process, particularly in the electronic printing field.

Meanwhile, there is an increasing need for a technology of patterning various types of inks by using the inkjet technology. For example, a line width of about 1 to 30 μm may be implemented by using an electrohydrodynamic (EHD) inkjet printing technique, or a large line width or coating may be implemented by using an inkjet or electrospray technique.

In addition, there is also a need for a technology of implementing various types of patterning by using inks having various viscosities. For example, drop-on-demand printing may be performed by using an ink having viscosity of 1 to 100 cP, or near-field electrospinning (NFES) printing may be performed by using an ink having viscosity of 100 to 1000 cP.

However, an apparatus for printed electronics in the related art has a limitation in that printing apparatuses, which correspond to the EHD printing, the drop-on-demand printing, the electrospray printing, and the NFES printing, need to be provided in order to implement the EHD printing, the drop-on-demand printing, the electrospray printing, and the NFES printing. In addition, there is also a problem in that printing cannot be performed by a single printing apparatus by using inks having different viscosities. Moreover, there is also a problem in that printing cannot be performed by a single printing apparatus by using a single nozzle and multiple nozzles together.

Therefore, the present applicant has proposed a technology related to an all-in-one printing apparatus for printed electronics in order to solve the above-mentioned problems, and as a document of the related art, there is Korean Patent No. 10-1348024 (published on Jan. 6, 2014).

DISCLOSURE

Technical Problem

The present invention has been made in an effort to solve the above-mentioned problems, and an object of the present invention is to provide an all-in-one printing apparatus for printed electronics which is capable of patterning various types of inks by using a single printing apparatus.

Another object of the present invention is to provide an all-in-one printing apparatus for printed electronics which is capable of implementing various line widths and implementing patterning by using inks having various viscosities.

The objects to be solved by the present invention are not limited to the above-mentioned objects, and other objects, which are not mentioned above, may be clearly understood by those skilled in the art from the present specification and the accompanying drawings.

Technical Solution

An aspect of the present invention provides a printing apparatus for printed electronics, the printing apparatus including: ejection head units which each have at least one nozzle for ejecting ink droplets to perform drop-on-demand or continuous printing; a jetting observation unit which is provided at one side of the nozzle and configured to observe the ink droplet ejected from the nozzle; a lighting unit which is provided at the other side of the nozzle and configured to provide light to the jetting observation unit; an alignment observation unit which is configured to observe an aligned state between the nozzle and a substrate; and a fluid supply unit which is configured to supply the ink to the nozzle, in which the ejection head units may include a single-nozzle head unit, and a multi-nozzle head unit provided separately from the single-nozzle head unit.

The single-nozzle head unit may include a head holder provided on a holder mounting unit installed on the printing apparatus, and a single nozzle detachably provided on the head holder, the nozzle may include a holding unit inserted into a mounting opening of the head holder, and a nozzle unit inserted into the holding unit, and electricity or heat may be applied to the substrate or at least one of the head holder and the nozzle.

The single-nozzle head unit may include a head holder provided on a holder mounting unit installed on the printing apparatus, and a single nozzle detachably provided on the head holder, and any one of an EHD head and a microfab head may be mounted on the head holder.

The EHD head may perform any one of drop-on-demand printing, electrospinning printing, and electrospray printing.

The multi-nozzle head unit may include a mount in which multiple nozzles are inserted and mounted, an adapter which is mounted on the mount and provided at one side of the multiple nozzles, and a fixing bolt which fixes the multiple nozzles to the mount.

The fluid supply unit may include at least one of a syringe pump or an air pressure control module.

The fluid supply unit may constantly control a flow rate of a fluid to be supplied or may control a pressure of a fluid to be supplied.

Inks having different physical properties may be supplied to the single-nozzle head unit and the multi-nozzle head unit, respectively, and the syringe pump may constantly control a flow rate of a fluid when the ink has a high viscosity or electrospray or continuous inkjet printing is performed, and the air pressure control module may control a pressure of a fluid to be supplied when drop-on-demand printing or inkjet printing is performed.

Advantageous Effects

According to the present invention printing apparatus for printed electronics as described above, it is possible to pattern various types of inks by using the single apparatus, and as a result, it is possible to avoid the inconvenience of providing various types of printing apparatuses.

The printing apparatus for printed electronics according to the present invention may perform printing by using the single printing apparatus even in a case in which various types of inks having different viscosities are used, and as a result, it is not necessary to provide apparatuses or nozzles that separately correspond to the viscosities of the ink.

The printing apparatus for printed electronics according to the present invention has the single nozzle and the multiple nozzles and may inject different types of inks to the single nozzle and the multiple nozzles, and as a result, more various patterning processes may be implemented for a short time at a low cost.

The effects of the present invention are not limited to the above-mentioned effects, and other effects, which are not mentioned above, may be clearly understood by those skilled in the art from the present specification and the accompanying drawings.

MODE FOR INVENTION

Figure 1:
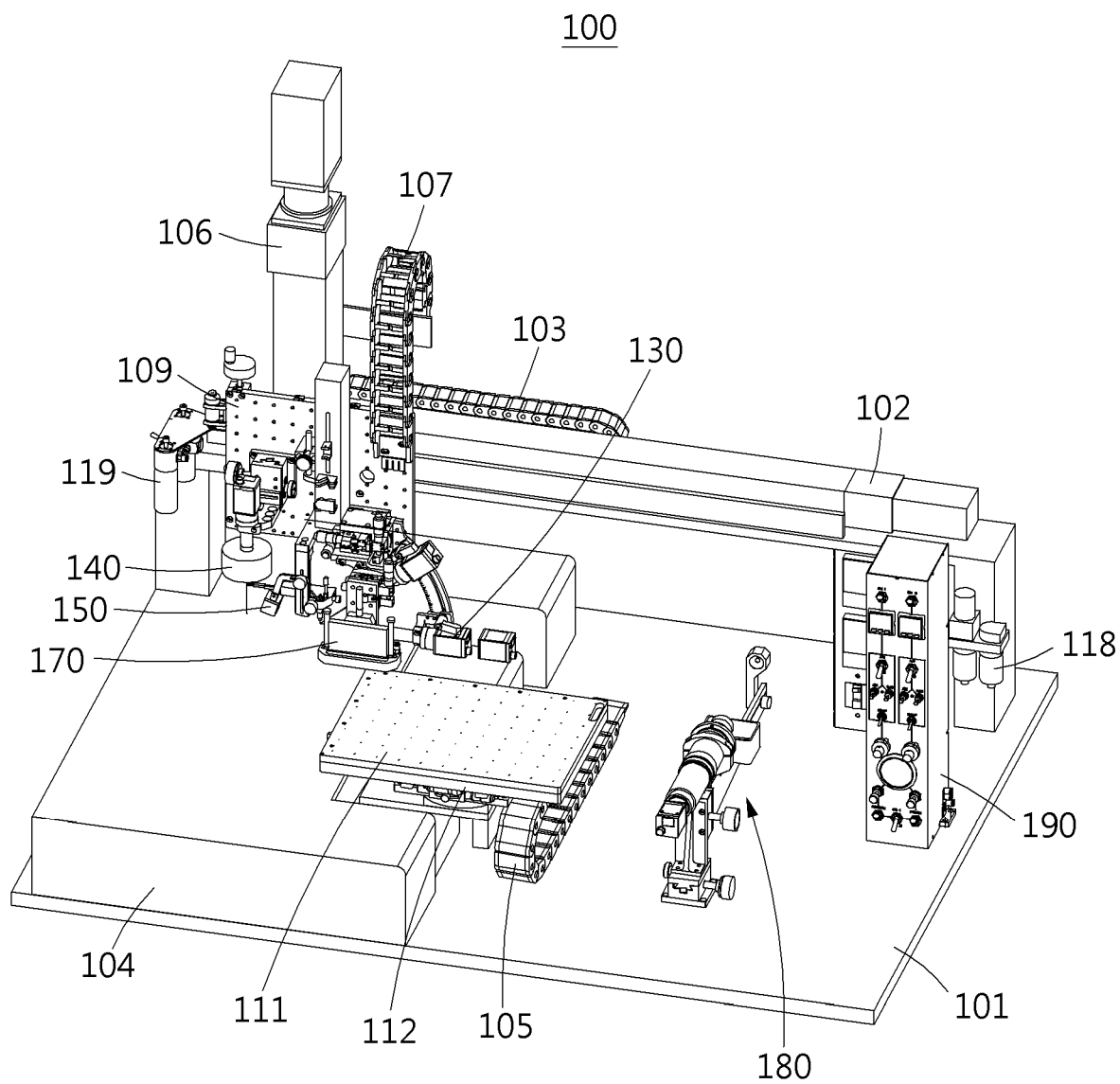
FIG. 1 is a perspective view schematically illustrating a printing apparatus for printed electronics according to an exemplary embodiment of the present invention.

Hereinafter, exemplary embodiments according to the present invention will be described in detail with reference to the accompanying drawings. However, the present invention is not restricted or limited by the exemplary embodiments. Like reference numerals indicated in the respective drawings refer to like members.

Figure 2:
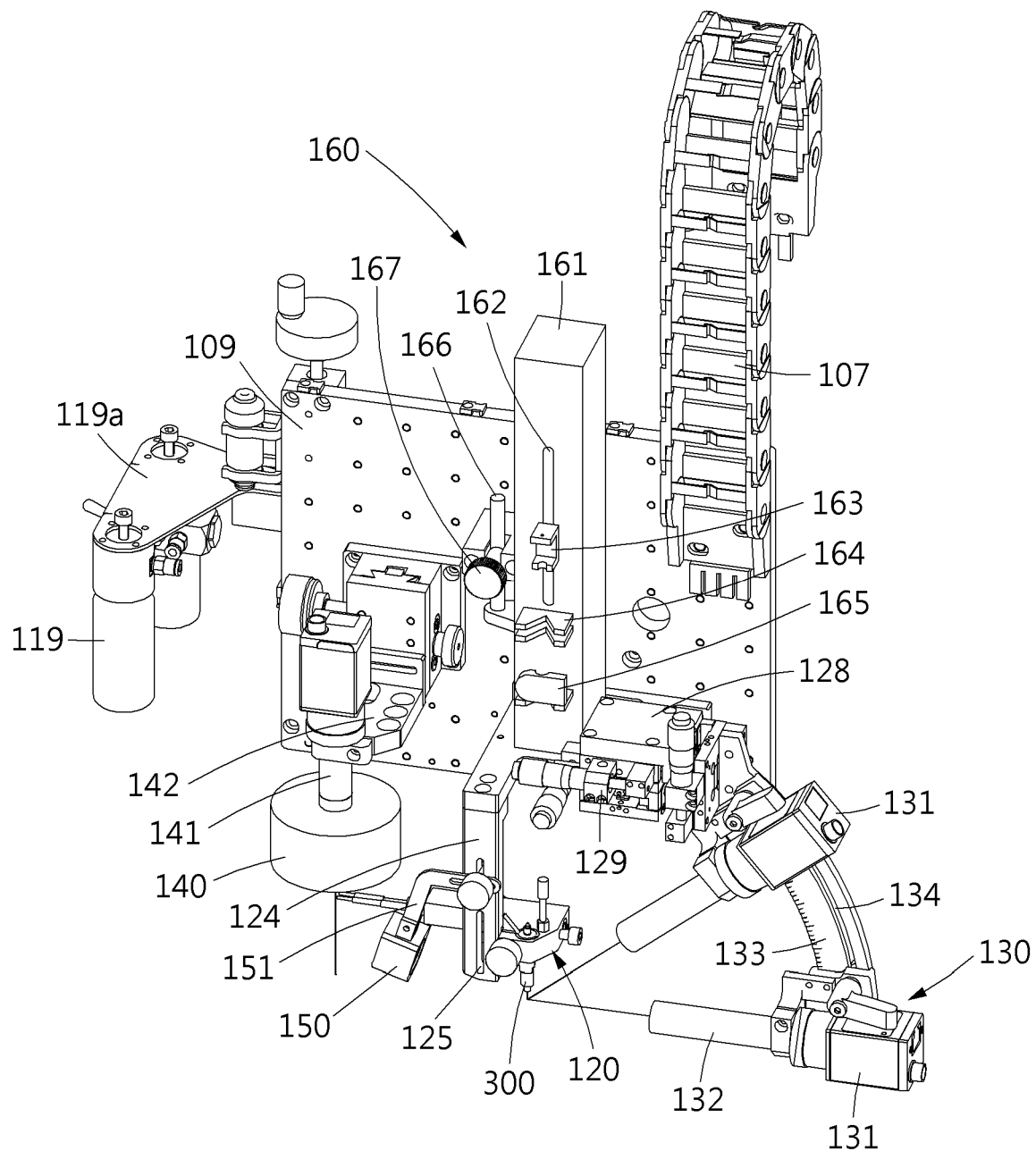
FIGS. 2 and 3 are views illustrating a main part of the printing apparatus for printed electronics illustrated in FIG. 1.
Figure 3:
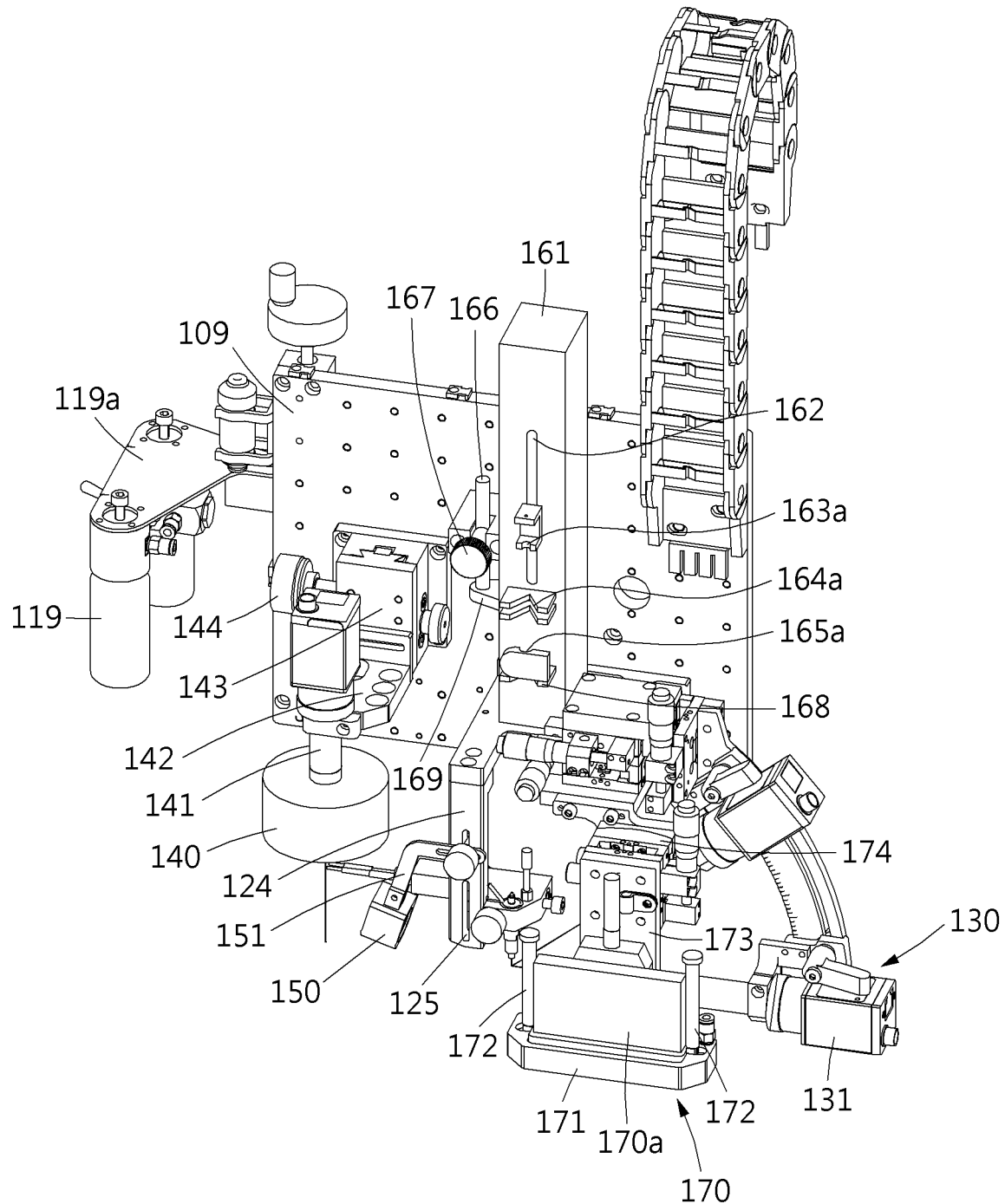
Figure 4:
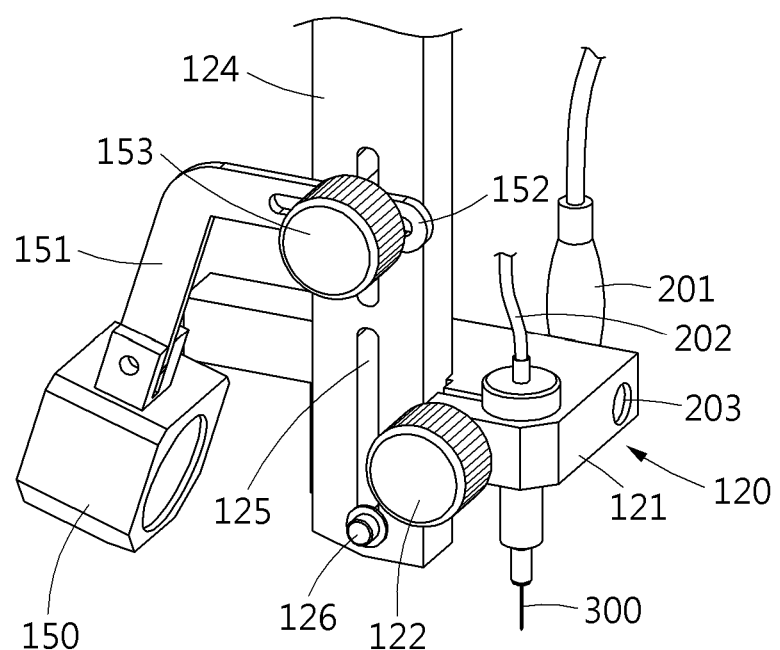
FIGS. 4 and 5 are views illustrating a single-nozzle head unit of the printing apparatus for printed electronics illustrated in FIG. 1.
Figure 5:
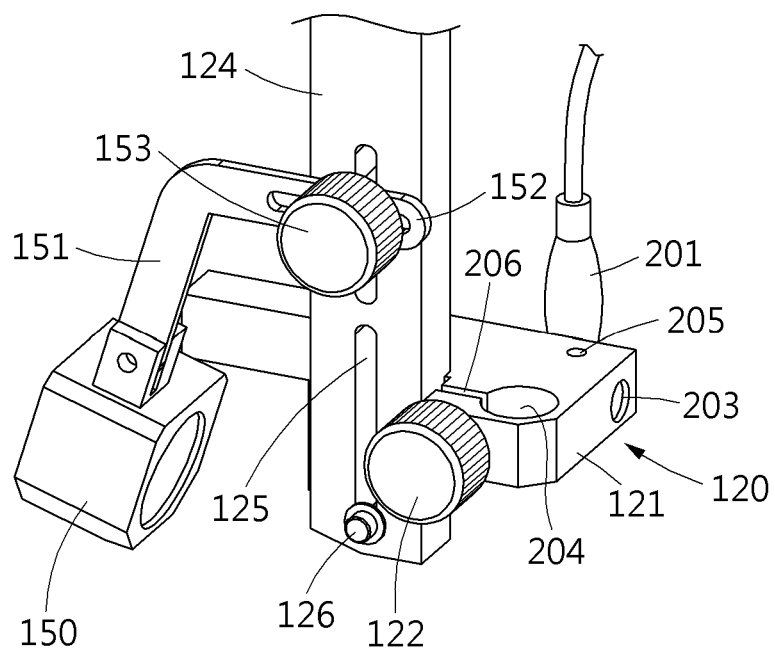
Figure 8:
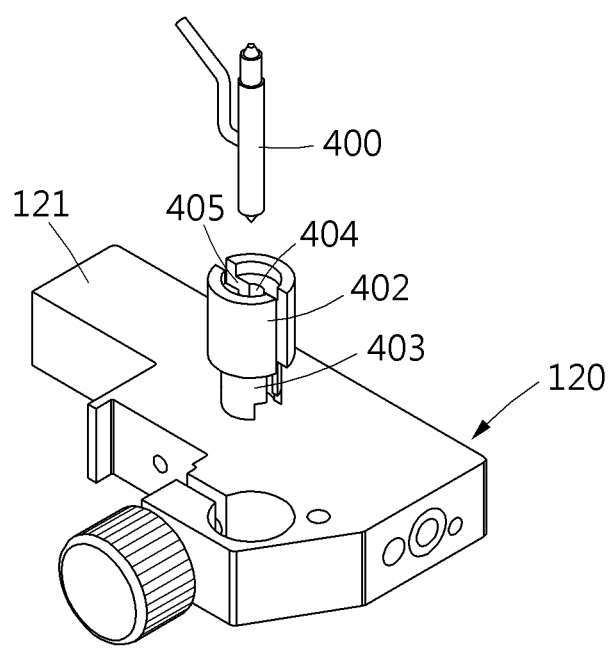
Figure 9:
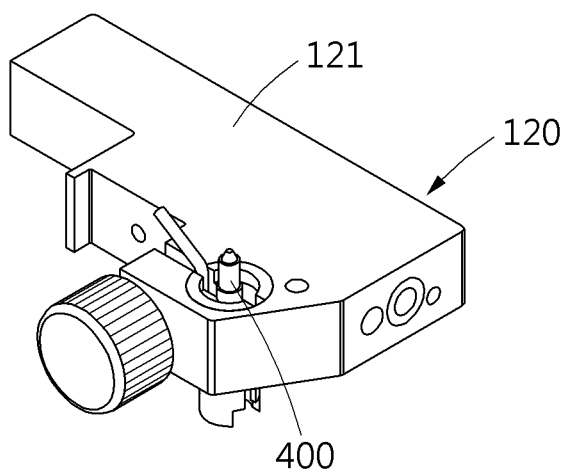
Figure 10:
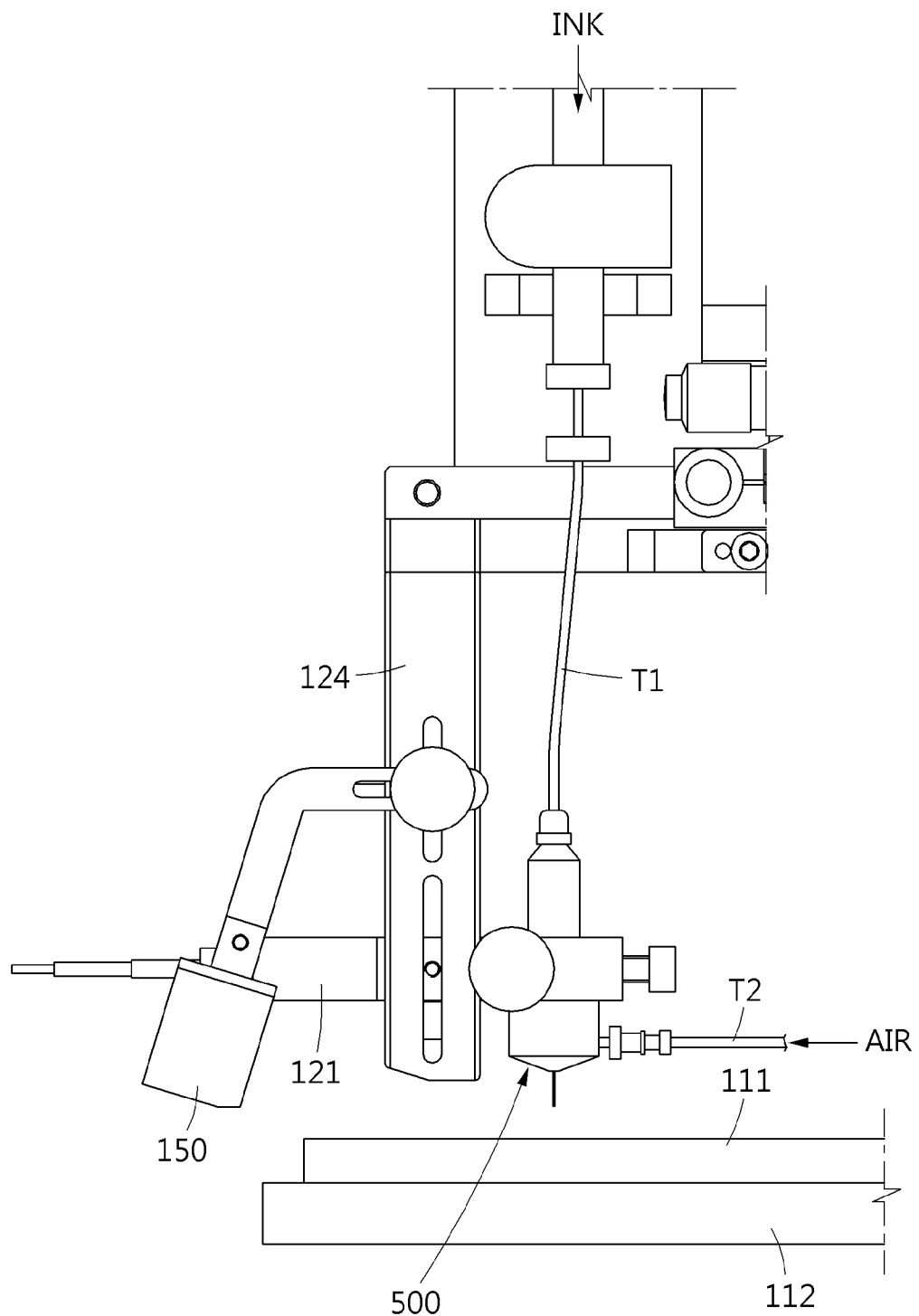
FIG. 10 is a view illustrating an example of use of the single-nozzle head unit illustrated in FIGS. 4 and 5.
Figure 11:
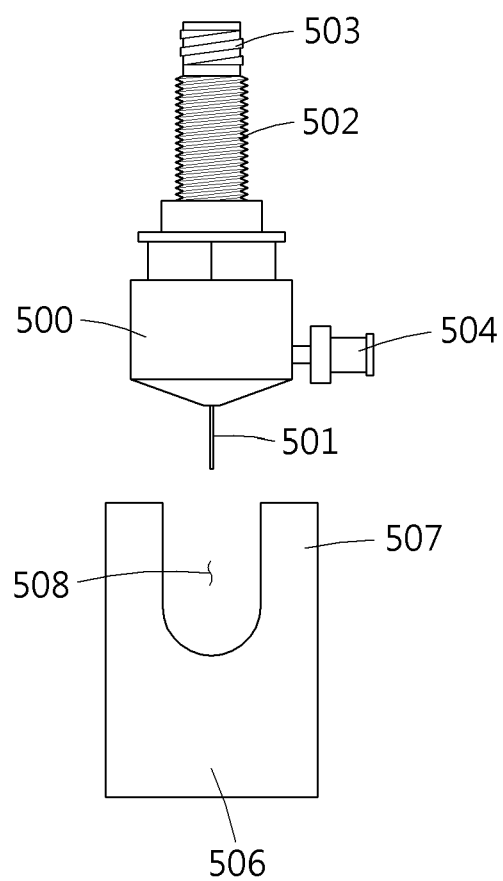
FIG. 11 is a view illustrating an example of a single nozzle used for the single-nozzle head unit illustrated in FIGS. 4 and 5.

FIG. 1 is a perspective view schematically illustrating a printing apparatus for printed electronics according to an exemplary embodiment of the present invention, FIGS. 2 and 3 are views illustrating a main part of the printing apparatus for printed electronics illustrated in FIG. 1, FIGS. 4 and 5 are views illustrating a single-nozzle head unit of the printing apparatus for printed electronics illustrated in FIG. 1, FIGS. 6 to 9 are views illustrating modified examples of the single-nozzle head unit illustrated in FIGS. 4 and 5, FIG. 10 is a view illustrating an example of use of the single-nozzle head unit illustrated in FIGS. 4 and 5, FIG. 11 is a view illustrating an example of a single nozzle used for the single-nozzle head unit illustrated in FIGS. 4 and 5, and FIGS. 12 and 13 are views illustrating a multi-nozzle head unit of the printing apparatus for printed electronics illustrated in FIG. 1.

Referring to FIGS. 1 to 3, a printing apparatus 100 for printed electronics according to an exemplary embodiment of the present invention may include: ejection head units 120 and 170 having one or more nozzles 300 and 170a which may perform drop-on-demand or continuous printing by ejecting ink droplets; a jetting observation unit 130 which is provided at one side of the nozzles 300 and 170a and configured to observe the ink droplets ejected from the nozzles 300 and 170a; a lighting unit 150 which is provided at the other side of the nozzles 300 and 170a and configured to provide light to the jetting observation unit 130; an alignment observation unit 140 which is configured to observe an aligned state between the nozzles 300 and 170a and a substrate 111; a lighting unit (not illustrated) which is configured to provide light to the alignment observation unit 140 configured to observe an aligned state of an ink pattern; and fluid supply units 160 and 190 which are configured to supply the ink to the nozzles 300 and 170a.

In more detail, as illustrated in FIG. 1, the printing apparatus 100 for printed electronics according to the exemplary embodiment of the present invention may include: Y stages 104 and 105 which are installed on a base frame 101 and configured as linear stages capable of controlling a position of the substrate 111; the ejection head units 120 and 170 which are positioned above a substrate holder 112; the substrate holder 112 which are provided on the Y stages 104 and 105 and on which a printing object or the substrate 111 is placed; Z stages 106 and 107 which are configured to adjust heights of the ejection head units 120 and 170; X stages 102 and 103 which are configured to control positions of the ejection head units 120 and 170 in an X-axis direction; the jetting observation unit 130 which are provided at one side of the ejection head units 120 and 170 and configured to observe an ejected state of the ink; and the alignment observation unit 140 which is provided to face the jetting observation unit 130 based on the ejection head units 120 and 170.

Meanwhile, a multi-nozzle jetting observation unit 180, which is configured to observe an ejected state of the ink ejected from the multi-nozzle head unit 170, may be further provided on the base frame 101.

The ejection head units 120 and 170 may be connected to an X-Z plate 109 which is connected to the X stages 102 and 103 and the Z stages 106 and 107 and may be linearly moved in the X-axis direction and the Z-axis direction. That is, the ejection head units 120 and 170 may control distances between the nozzles and the substrate and control ejection positions while moving together with the X-Z plate 109 in the X-axis direction and the Z-axis direction.

A syringe pump 160 to be described below may be detachably provided on the X-Z plate 109, and a first fluid storage unit 119, which is connected to the syringe pump 160 or the single-nozzle head unit 120, may be provided at one side of the X-Z plate 109.

Meanwhile, an air pressure control module 190 may be provided at one side of the base frame 101, particularly, on the base frame 101 so as to face the first fluid storage unit 119. A second fluid storage unit 118, which is connected to the air pressure control module 190, may be provided on the air pressure control module 190. Here, the ink used for printing may be stored in the first and second fluid storage units 119 and 118. In addition, the ink may be moved to a tip.

Referring to FIGS. 2 and 3, a storage unit frame 119a may be attached at one side of the X-Z plate 109, and the first fluid storage unit 119 may be connected to the storage unit frame 119a. In addition, since all of the alignment observation unit 140, the lighting unit 150, the ejection head unit 120, the jetting observation unit 130, and the syringe pump 160 are connected to the X-Z plate 109, the alignment observation unit 140, the lighting unit 150, the ejection head unit 120, the jetting observation unit 130, and the syringe pump 160 may be moved together with the X-Z plate 109 in the X-axis direction and the Z-axis direction.

The alignment observation unit 140 may capture an image of the substrate 111 and observe the substrate 111, and the alignment observation unit 140 may calculate offset distances between the alignment observation unit 140 and the ejection head units 120 and 170 and may accurately control or determine the positions of the ejection head units 120 and 170 by using the calculated offset distances.

The alignment observation unit 140 may be connected to an image transmitting unit 141, and the image transmitting unit 141 may be fixed to a support frame 142 fixed to the X-Z plate 109.

The lighting unit 150 and the single-nozzle head unit 120 of the ejection head units are detachably mounted on a holder mounting unit 124. The holder mounting unit 124 may be fixed to the X-Z plate 109.

The lighting unit 150 may be mounted on a lighting frame 151 connected to the holder mounting unit 124. A slot 125 is formed in the holder mounting unit 124 in a longitudinal direction thereof. The lighting frame 151 may be mounted in the slot 125, and the upward and downward position of the lighting frame 151 may be adjusted. The lighting frame 151 and the holder mounting unit 124 may be connected by a bolt unit (not illustrated).

The single-nozzle head unit 120 may be detachably connected to the holder mounting unit 124.

The syringe pump 160, which is configured to control a fluid such as an ink to be supplied to the single nozzle 300 of the single-nozzle head unit 120, may be provided at one side of the holder mounting unit 124.

The syringe pump 160 is one of the fluid supply units and serves to constantly control a flow rate of the fluid such as the ink to be supplied to the single nozzle 300. In more detail, the syringe pump 160 may include: a pump main body 161 which is detachably provided on the X-Z plate 109; a guide slot 162 which is formed vertically at a central portion of the pump main body 161; a syringe pressing unit 163 which is attached to the guide slot 162 and may move vertically along the guide slot 162; a syringe support unit 164 which is provided below the syringe pressing unit 163; and a syringe attaching/detaching unit 165 which is provided below the syringe support unit 164. In addition, at one side of the pump main body 161, there are further provided a bolt unit 167 which is configured to mount the pump main body 161 on the X-Z plate 109, and a fixing rod 166 which is fixed by being pressed by the bolt unit 167 and formed integrally with the pump main body 161.

A structure of the syringe pump 160 will be described in more detail with reference to FIG. 3. A piston seating groove 163a in which a piston (not illustrated) of a syringe-shaped syringe (not illustrated) is seated may be formed in the syringe pressing unit 163 configured to move vertically along the guide slot 162. A syringe seating groove 164a in which a syringe main body (not illustrated) is placed may be formed in the syringe support unit 164.

The syringe attaching/detaching unit 165 may be hinge-connected to the pump main body 161 so that one side of the syringe attaching/detaching unit 165 may be rotated. As illustrated in FIG. 3, a left end of the syringe attaching/detaching unit 165 may be moved upward so that the left end of the syringe attaching/detaching unit 165 may be separated from the pump main body 161. A right end of the syringe attaching/detaching unit 165 may be hinge-connected to the pump main body 161. In this case, an elastically restoring member (not illustrated), which is configured to restore the syringe attaching/detaching unit 165 to a closed state, may be provided between the syringe attaching/detaching unit 165 and the pump main body 161. In addition, a syringe seating groove 165a in which the syringe main body is placed may be formed in an inner surface of the syringe attaching/detaching unit 165.

A lower end support unit 168, which is configured to support a stepped portion (not illustrated) (i.e., a portion with which an injection needle is generally fitted) at a lower end of the syringe main body, may be provided below the syringe attaching/detaching unit 165. The lower end support unit 168 may have a support groove (not illustrated) in which a fluid tube mounting unit (not illustrated) of the syringe main body is placed. A fluid tube (not illustrated), which is connected to the fluid tube mounting unit, is connected to the single nozzle 300 and supplies the fluid such as the ink, which is stored in the syringe main body, to the single nozzle 300.

Meanwhile, referring to FIG. 2, the jetting observation unit 130 may include: an arc-shaped arc frame 133 which is mounted on the X-Z plate 109 and has a predetermined curvature; an arc slot 134 which is penetratively formed at a central portion of the arc frame 133 and has the same curvature as the arc frame 133; a movable unit 131 which is configured to move along the arc slot 134; and an image capturing unit 132 which is provided on the movable unit 131 and configured to acquire a jetting image. FIG. 2 illustrates the two movable units 131 and the two image capturing units 132, but the two movable units 131 and the two image capturing units 132 are illustrated just for explaining that the movable unit 131 and the image capturing unit 132 are moved along the arc slot 134. Therefore, the single movable unit 131 and the single image capturing unit 132 may be provided.

The jetting observation unit 130 captures an ejection image from a lateral side of the single-nozzle head unit 120 or the multi-nozzle head unit 170, and the jetting observation unit 130 may be used to observe the substrate 111 on which an ink droplet is dropped, observe a portion of the nozzle, observe a portion of the nozzle where the ink is dropped, or set up the nozzle.

Referring to FIG. 3, the multi-nozzle head unit 170 may be provided at a position forward from the jetting observation unit 130, that is, a position that faces the X-Z plate 109 based on the jetting observation unit 130. The multi-nozzle head unit 170 may include: a mount 171 in which the multiple nozzles 170a are inserted and mounted; an adapter 176 which is mounted on the mount 171 and provided at one side of the multiple nozzles 170a; and fixing bolts 172 which fix the multiple nozzles 170a to the mount 171. The fixing bolts 172 may be provided at both ends in a longitudinal direction of the multiple nozzles 170a. The multiple nozzles 170a and the adapter 176 may be fixed to the mount 171 by fastening the fixing bolts 172.

The above-mentioned multi-nozzle jetting observation unit 180 may be provided at one side of the multi-nozzle head unit 170 and may capture an image of or monitor a jetting state of the ink ejected from the multiple nozzles 170a.

As described above, the ejection head units 120 and 170 of the printing apparatus 100 for printed electronics according to the exemplary embodiment of the present invention may include the single-nozzle head unit 120, and the multi-nozzle head unit 170 provided separately from the single-nozzle head unit 120.

The single-nozzle head unit 120 will be described below with reference to FIGS. 4 to 9.

Referring to FIGS. 4 and 5, a head holder 121 may be fixed to the holder mounting unit 124 by a connecting member 126 fitted into the slot 125 of the holder mounting unit 124. A bolt or a screw may be used as the connecting member 126 in order to easily connect and separate the head holder 121 and the holder mounting unit 124.

The lighting unit 150, which provides light to the ink droplet ejected from single-nozzle head unit 120 or provides light to the substrate 111, may be connected to the slot 125 of the holder mounting unit 124. The lighting unit 150 is provided at one side of the single-nozzle head unit 120 and provides light to an end of the single nozzle 300 or to a surface of the substrate 111.

The lighting unit 150 is connected to one end of the lighting frame 151. The lighting unit 150 may be connected to the lighting frame 151 such that the lighting unit 150 pivots on one end of the lighting frame 151. Therefore, it is possible to adjust a position or an angle at which the lighting unit 150 provides light.

The lighting frame 151 may be connected to the holder mounting unit 124. To this end, a guide hole 152 may be penetratively formed at the other end of the lighting frame 151. The slot 152 of the lighting frame 151 and the slot 125 of the holder mounting unit 124 overlap each other so that the slot 152 of the lighting frame 151 and the slot 125 of the holder mounting unit 124 communicate with each other, and then the connecting member 153 is fitted into the slots 152 and 125, such that the lighting frame 151 and the holder mounting unit 124 may be connected to each other.

A height or position of the lighting unit 150 may be adjusted along the slot 152. That is, a fastened state between the holder mounting unit 124 and the lighting frame 151 is released by rotating the connecting member 153, the position, the height, or the angle of the lighting frame 151 is adjusted, and then the connecting member 153 is tightened.

The slot 125 for fastening the head holder 121 and the slot 125 for fastening the lighting frame 151 may be separately provided in the holder mounting unit 124. The slot 125 for mounting the head holder 121 is formed below the slot 125 for mounting the lighting frame 151, and the two slots 125 are separated from each other. In some instances, the two slots 125 may be integrally formed in the holder mounting unit 124.

Referring to FIGS. 4 and 5, the head holder 121 may include a head mounting portion 204 which is penetratively formed in the head holder 121 and in which a head of the single nozzle 300 is mounted, and a power connecting portion 205 which is formed at one side of the head holder 121 and connected to a power line 201.

The head holder 121 has a slit 206 which allows the head mounting portion 204 to communicate with one end of the head holder 121, and a slit adjusting member 122 which is configured to adjust a width of the slit 206.

Meanwhile, non-described reference numeral "203" in the drawings indicates a mounting hole penetratively formed in the head holder 121, and the mounting hole may be used to mount a heater (not illustrated) to the head holder 121.

FIGS. 4 and 5 illustrate a case in which the head of the single nozzle 300 for electrohydrodynamic inkjet printing is mounted on the head mounting portion 204 of the head holder 121. In addition to the nozzle for electrohydrodynamic inkjet printing, various types of single nozzles may be used by being mounted on the single-nozzle head unit 120 of the printing apparatus 100 for printed electronics according to the exemplary embodiment of the present invention.

Figure 6:
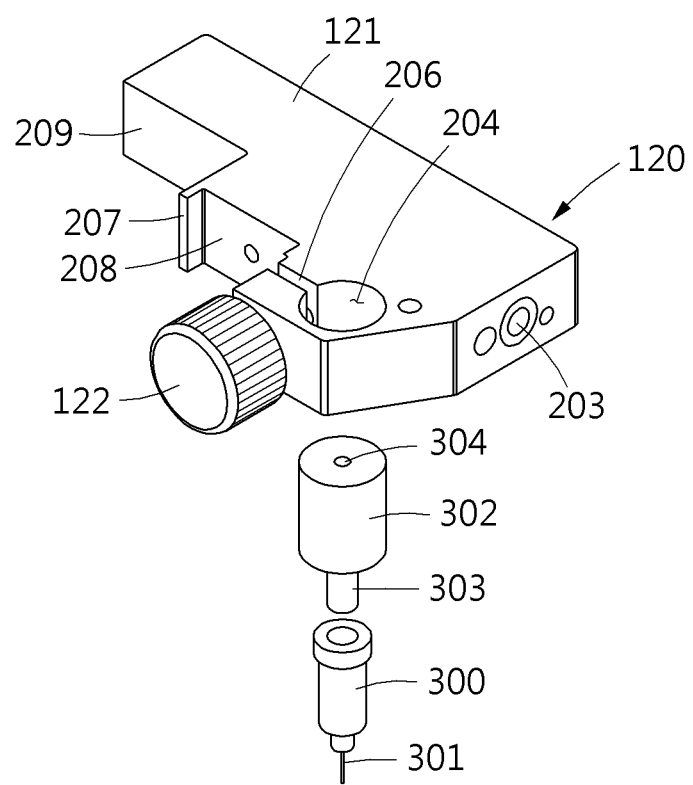
FIGS. 6 to 9 are views illustrating modified examples of the single-nozzle head unit illustrated in FIGS. 4 and 5.
Figure 7:
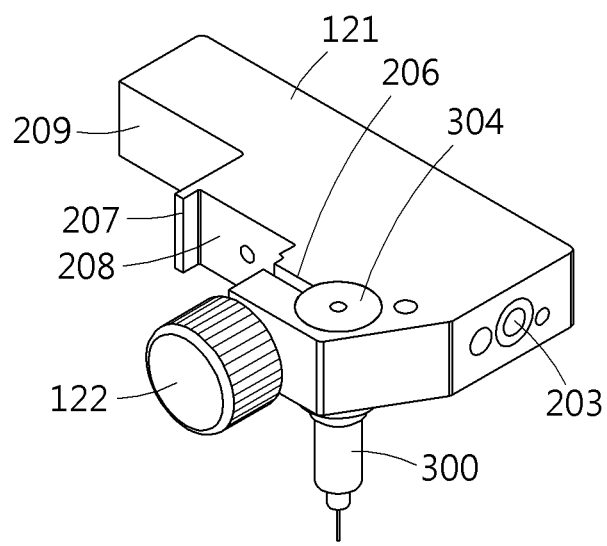

FIGS. 6 and 7 illustrate the single-nozzle head unit 120 to which the single nozzle for electrohydrodynamic inkjet printing is attached. At one side of the head holder 121, there may be provided a first seating surface 208 on which the holder mounting unit 124 is seated, and a second seating surface 209 which is formed to have a level difference from the first seating surface 208. A width of the second seating surface 209 is smaller than a width of the first seating surface 208, such that the lighting unit 150 is prevented from interfering with the head holder 121.

A protruding portion 207 may be formed at one end of the first seating surface 208 which is adjacent to the second seating surface 209. The protruding portion 207 may serve to guide the holder mounting unit 124 so that the holder mounting unit 124 does not deviate from the first seating surface 208, or the protruding portion 207 may serve to guide an initial position of the holder mounting unit 124 when the holder mounting unit 124 is mounted.

An electrode head 302, which is made of a material to which electricity or heat for electrohydrodynamic inkjet printing may be applied, may be mounted on the head mounting portion 204. The electrode head 302 may be made of metal. The electrode head 302 has a shape in which a large cylindrical portion and a small cylindrical portion 303 are disposed vertically, and an ink injecting tube 304 may be penetratively formed at a central portion of the electrode head. The single nozzle 300 is fitted with the small cylindrical portion 303. An ejection tip 301 may be formed at an end of the single nozzle 300.

Here, air may be supplied to the single nozzle 300 to spray the ink ejected from the ejection tip 301. In this case, the single-nozzle head unit 120 performs electrospray printing.

Meanwhile, electricity or heat may be applied to at least one of the head holder 121 and the nozzle 300, or electricity or heat may be applied to the substrate 111.

Unlike FIGS. 6 and 7, FIGS. 8 and 9 illustrate a case in which another type of single nozzle 400 is mounted. Because a shape of the head holder 121 illustrated in FIGS. 8 and 9 is identical to the shape of the head holder 121 illustrated in FIGS. 6 and 7, a repeated description of the head holder 121 will be omitted.

The head of the single nozzle 300 illustrated in FIGS. 6 and 7 is an electrohydrodynamic (EHD) head, while a head of the single nozzle 400 illustrated in FIGS. 8 and 9 is a microfab head. Referring to FIGS. 8 and 9, because the single nozzle 400 is smaller than the head mounting portion 204, a head adapter 402 is inserted into the head mounting portion 204, and the single nozzle 400 is inserted into the head adapter 402.

The head adapter 402 includes a large cylindrical portion, and a small cylindrical portion 403 formed at a lower side of the large cylindrical portion. A mounting opening 404 into which the single nozzle 400 is inserted may be penetratively formed at a central portion of the head adapter 402. The large cylindrical portion of the head adapter 402 may be slightly interference-fitted into the head mounting portion 204, and a cut-out portion 405 may be formed at one side of the head mounting portion 204 so that the interference fit is enabled.

FIG. 10 is a view illustrating an example of use of the single-nozzle head unit 120 of the printing apparatus 100 for printed electronics according to the exemplary embodiment of the present invention. A fluid tube T1 connected to a syringe pump 600 may be connected to an upper end of a single nozzle 500 mounted on the head holder 121, or a fluid tube (not illustrated) may be connected to the upper end of the single nozzle 500 through the first fluid storage unit 119, or an air tube T2 for injecting air may be connected to a lateral portion of the single nozzle 500. The single nozzle 500 illustrated in FIG. 10 may perform electrospray printing.

FIG. 11 is a view of the single nozzle 500 illustrated in FIG. 10. The single nozzle 500 is inserted into the head mounting portion 204 of the head holder 121, and a separate adapter 506 may be provided in a case in which the head mounting portion 204 is larger than the single nozzle 500. That is, an adapter 506 may be inserted into the head mounting portion 204 first, and then the single nozzle 500 may be mounted on the adapter 506.

An ejection tip 501 is provided at a lower end of the single nozzle 500, and a fluid injecting unit 503 connected to the fluid tube T1 may be provided at an upper end of the single nozzle 500. A threaded portion 502 for connection with the fluid tube T1 may be formed on an outer surface of the fluid injecting unit 503. An air injecting unit 504 to be connected to the air tube T2 may be formed at a lateral portion of the single nozzle 500.

A groove 508, which allows the air injecting unit 504 to be exposed, may be formed at an upper side of the adapter 506, and curved surface portions 507 may be formed at both sides of the groove 508.

As described above, the printing apparatus 100 for printed electronics according to the exemplary embodiment of the present invention has the single-nozzle head unit 120, and the single nozzles 300, 400, and 500 having various shapes are mounted on the single nozzle head 120, and as a result, it is possible to perform one of the drop-on-demand printing, the electrospinning printing, and the electrospray printing.

The syringe pump 160 may be connected to the single nozzles 300, 400, and 500 so as to supply the fluid such as the ink to the single nozzles 300, 400, and 500. In more detail, the fluid tube T1 connected to the syringe pump 160 may be connected to the single nozzles 300, 400, and 500. The syringe pump 160 may constantly control a flow rate of the fluid such as the ink to be supplied to the single nozzles 300, 400, and 500.

The syringe pump 160 serves to constantly control or maintain a flow rate of the fluid such as the ink when performing the continuous inkjet printing (continuous jet mode), electrospray printing, or printing that uses an ink having high viscosity. To this end, a direct current voltage (DC voltage) needs to be used.

As described above, the syringe pump 160 may constantly control a flow rate of the fluid when performing electrospray printing, continuous inkjet printing, or printing that uses an ink having high viscosity.

Figure 12:
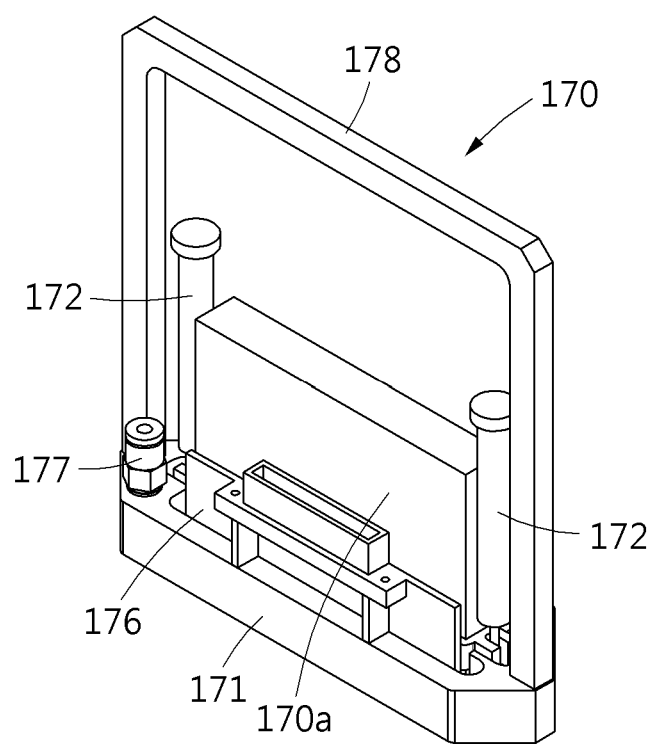
FIGS. 12 and 13 are views illustrating a multi-nozzle head unit of the printing apparatus for printed electronics illustrated in FIG. 1.
Figure 13:
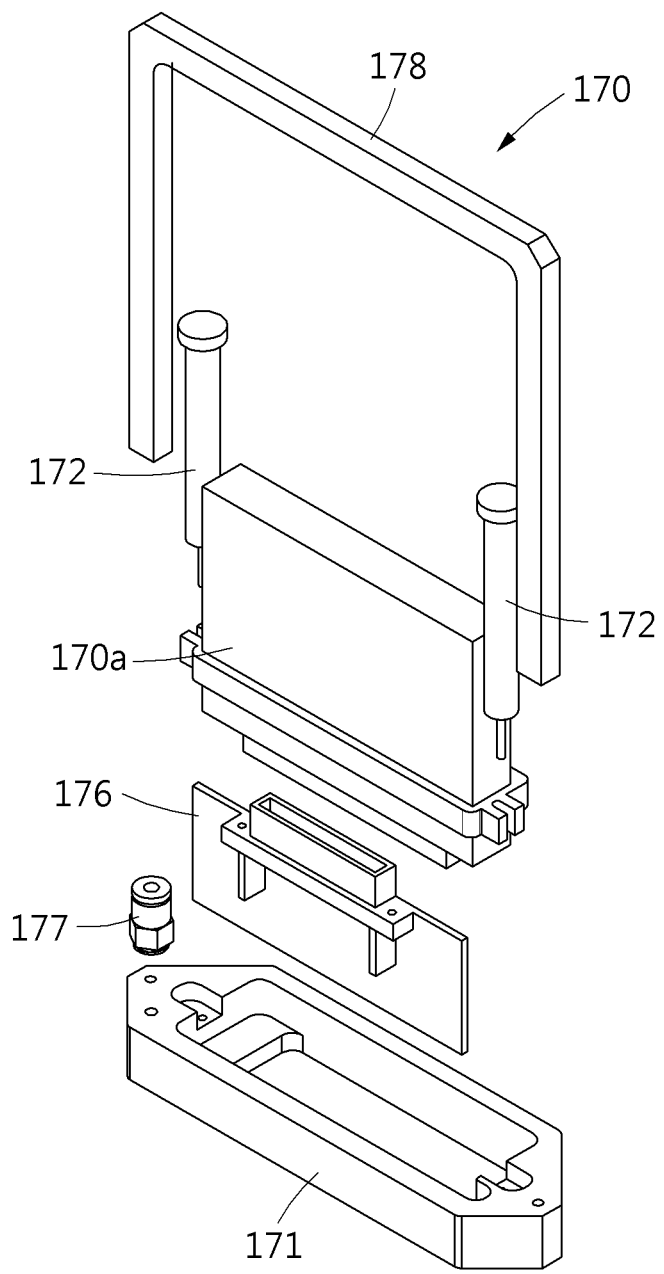

Meanwhile, the printing apparatus 100 for printed electronics according to the exemplary embodiment of the present invention also has the multi-nozzle head unit 170 as well as the single-nozzle head unit 120. FIGS. 12 and 13 illustrate the multi-nozzle head unit 170.

The multi-nozzle head unit 170 may include: the mount 171 in which the multiple nozzles 170a are inserted and mounted; the adapter 176 which is inserted and mounted in the mount 171 and provided at one side of the multiple nozzles 170a; and the fixing bolts 172 which fix the multiple nozzles 170a to the mount 171. The fixing bolts 172 are provided at both sides in the longitudinal direction of the multiple nozzles 170a and fix the multiple nozzles 170a and the adapter 176 to the mount 171. A bracket 178 may be provided outside the fixing bolts 172 and fastened to the mount 171.

An air pressure port 177 may be mounted on the mount 171. The air pressure port 177 may be used to purge or suction the ink ejected from the multiple nozzles 170a or form a meniscus in the ink.

Meanwhile, the air pressure control module 190 may be connected to the multi-nozzle head unit 170 in order to eject the ink by using the multi-nozzle head unit 170.

The air pressure control module 190 may control a pressure of the fluid to be supplied when performing the drop-on-demand printing or the inkjet printing by using the multi-nozzle head unit 170. The air pressure control module 190 may control a pressure of the fluid so that a negative pressure is applied when performing the inkjet printing.

Furthermore, the air pressure control module 190 may be connected to the single nozzle 300 for electrohydrodynamic inkjet printing and control a pressure of the fluid. The air pressure control module 190 may control a pressure of the fluid so that a positive pressure is applied when performing the electrohydrodynamic inkjet printing.

As described above, the printing apparatus 100 for printed electronics according to the exemplary embodiment of the present invention has the single-nozzle head unit 120 and the multi-nozzle head unit 170, and as a result, it is possible to supply various types of inks having different physical properties to the single-nozzle head unit 120 and the multi-nozzle head unit 170 and to eject the ink to the same position for a short time.

Various types of inks having different physical properties such as different viscosities may be injected into the single-nozzle head unit 120 and the multi-nozzle head unit 170. The position of the nozzle of the single-nozzle head unit 120 and the positions of the nozzles of the multi-nozzle head unit 170 may be calibrated by the alignment observation unit 140, and as a result, it is possible to eject various types of inks having different physical properties within several seconds to the same position or a desired position. In this case, the amount of dropping is controlled by the ejected ink droplets.

The printing apparatus 100 for printed electronics according to the exemplary embodiment of the present invention has the fluid supply units. As described above, the fluid supply units may include at least one of the syringe pump 160 and the air pressure control module 190.

The syringe pump 160 or the air pressure control module 190 may be used as the fluid supply unit depending on the viscosity of the ink to be used or a jetting method. For example, the air pressure control module 190 is required for the inkjet printing and the drop-on-demand electrohydrodynamic (EHD) inkjet printing. In this case, the inkjet printing is controlled with a negative pressure, and the electrohydrodynamic inkjet printing is controlled with a positive pressure.

In contrast, in the case in which the viscosity of the ink to be used is high, that is, 1,000 cP (centipoise) or more, or in the case of the electrohydrodynamic inkjet printing that uses the ink and a nozzle having a small size or 1 m or less, a method of constantly controlling a flow rate by using the syringe pump 160 is used. In addition, even in the case of the electrospray printing, the syringe pump 160 for constantly controlling a flow rate is used.

The printing apparatus 100 for printed electronics according to the present invention, which has been described above, may pattern various types of inks by using the single apparatus. To this end, the single-nozzle head unit for the electrohydrodynamic (EHD) inkjet printing and the inkjet single nozzle and the multi-nozzle head unit are separately provided. Therefore, the drop-on-demand printing, the near-field electrospinning (NFES) printing, and the electrospray printing may be implemented by the single apparatus 100.

The printing apparatus 100 for printed electronics according to the present invention may implement patterning of various line widths. With the use of the single all-in-one printing apparatus 100 for printed electronics, the electrohydrodynamic inkjet printing may be used for patterning of a small line width of about 1 to 30 m, and the inkjet or electrospray printing may be used for a large line width and coating.

In addition, various types of inks having various viscosities may be used. For example, with the use of the single all-in-one printing apparatus for printed electronics, the drop-on-demand printing may be performed by using an ink having viscosity of 1 to 100 cP, or the near-field electrospinning (NFES) printing may be performed by using an ink having viscosity of 100 to 1000 cP.

While the exemplary embodiments of the present invention have been described above with reference to particular contents such as specific constituent elements, the limited exemplary embodiments, and the drawings, but the exemplary embodiments are provided merely for the purpose of helping understand the present invention overall, and the present invention is not limited to the exemplary embodiment, and may be variously modified and altered from the disclosure by those skilled in the art to which the present invention pertains. Accordingly, the spirit of the present invention should not be limited to the described exemplary embodiment, and all of the equivalents or equivalent modifications of the claims as well as the appended claims belong to the scope of the spirit of the present invention.

The invention claimed is:

1. A printing apparatus for printed electronics, the printing apparatus comprising:
    ejection head units which each have at least one nozzle for ejecting ink droplets to perform drop-on-demand or continuous printing;
    a jetting observation unit which is provided at one side of the at least one nozzle and configured to observe the ink droplets ejected from the at least one nozzle;
    a lighting unit which is provided at another side of the at least one nozzle and configured to provide light to the jetting observation unit;
    an alignment observation unit which is configured to observe an aligned state between the at least one nozzle and a substrate;
    an X-Z plate which is connected to the alignment observation unit, the lighting unit, the ejection head unit and the jetting observation unit; and
    a fluid supply unit which includes a syringe pump and is configured to supply ink to the at least one nozzle,
    wherein the ejection head units include a single-nozzle head unit, and a multi-nozzle head unit provided separately from the single-nozzle head unit,
    wherein the jetting observation unit includes an arc-shaped arc frame which is mounted on the X-Z plate and has a predetermined curvature, an arc slot which is penetratively formed at a central portion of the arc frame and has a curvature corresponding to the predetermined curvature of the arc frame, a movable unit which is configured to move along the arc slot and an image capturing unit which is provided on the movable unit and configured to acquire a jetting image, and
    wherein the alignment observation unit captures an image of the substrate, observes the substrate, calculates offset distances between the alignment observation unit and the ejection head units and controls or determines positions of the ejection head units by using the calculated offset distances, and
    wherein the alignment observation unit, the lighting unit, the ejection head unit and the jetting observation unit are moved together with the X-Z plate in the X-axis direction and the Z-axis direction, and
    wherein the single-nozzle head unit includes a head holder fastened to a holder mounting unit fixed to the X-Z plate and a single nozzle mounted in the head holder, and
    wherein the head holder includes a first seating surface at one side thereof and a second seating surface having a level difference from the first seating surface, and the holder mounting unit is seated on the first seating surface,
    wherein a width of the second seating surface is smaller than a width of the first seating surface, such that the lighting unit is prevented from interfering with the head holder,
    wherein the first seating surface includes a protruding portion which is adjacent to the second seating surface, and the protruding portion is configured to guide the holder mounting unit such that the holder mounting unit does not deviate from the first seating surface, or the protruding portion is configured to guide an initial position of the holder mounting unit when the holder mounting unit is mounted.

2. The printing apparatus of claim 1, configured to apply electricity or heat to the substrate or at least one of the head holder and the at least one nozzle.

3. The printing apparatus of claim 1, wherein an electrohydrodynamic (EHD) head is mounted on the head holder.

4. The printing apparatus of claim 3, wherein the EHD head performs any one of drop-on-demand printing, electrospinning printing, and electrospray printing.

5. The printing apparatus of claim 1, wherein the multi-nozzle head unit is disposed at a position that faces the X-Z plate based on the jetting observation unit, and the multi-nozzle head unit includes a mount in which the at least one nozzle is inserted and mounted; an adapter which is mounted on the mount and disposed at one side of the at least one nozzle; fixing bolts which fix the at least one nozzle to the mount a bracket which has an ∩ shape and is provided outside the fixing bolts and fastened to the mount and an air pressure port which is mounted on the mount, and the fixing bolts are disposed on one side and another side of the at least one nozzle in a longitudinal direction of the at least one nozzle, and the at least one nozzle and the adapter are fixed to the mount by the fixing bolts, and the air pressure port is configured to purge or suction the ink ejected from the at least one nozzle or form a meniscus in the ink.

6. The printing apparatus of claim 1, wherein the fluid supply unit constantly controls a flow rate of a fluid to be supplied or controls a pressure of the fluid to be supplied.

7. The printing apparatus of claim 6, wherein the ink having different physical properties is supplied to the single-nozzle head unit and the multi-nozzle head unit, respectively, and the syringe pump constantly controls the flow rate of the fluid when the ink has a high viscosity or electrospray or continuous inkjet printing is performed.

* * * * *